(12) United States Patent
Tsuboyama et al.

(10) Patent No.: US 6,737,127 B2
(45) Date of Patent: May 18, 2004

(54) LIQUID CRYSTAL DEVICE AND ORGANIC ELECTROLUMINESCENCE DEVICE USING THE SAME

(75) Inventors: Akira Tsuboyama, Kanagawa (JP); Shinjiro Okada, Kanagawa (JP); Takao Takiguchi, Tokyo (JP); Seishi Miura, Kanagawa (JP); Takashi Moriyama, Kanagawa (JP); Jun Kamatani, Kanagawa (JP); Manabu Furugori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 10/152,826

(22) Filed: May 23, 2002

(65) Prior Publication Data

US 2002/0180925 A1 Dec. 5, 2002

(30) Foreign Application Priority Data

May 31, 2001 (JP) ........................................ 2001/164348

(51) Int. Cl.[7] ........................ C09K 19/58; H05B 33/14; H05B 33/22; H01J 1/62
(52) U.S. Cl. ........................ 428/1.4; 428/1.3; 428/917; 313/506; 313/509; 252/299.3
(58) Field of Search ........................ 252/299.3, 299.01; 428/1.1, 1.4, 690, 917; 313/504, 509

(56) References Cited

U.S. PATENT DOCUMENTS 6,491,847 B1 * 12/2002 Takiguchi et al. ..... 252/299.62
6,528,940 B1 * 3/2003 Okada et al. ................ 313/505

OTHER PUBLICATIONS

C.H. Chen, et al., "Recent Developments in Molecular Organic Electroluminescent Materials", Macromol. Symp. vol. 125, pp. 1–48 (1997).
N. Boden, et al., "Electron Transport Along Molecular Stacks in Discotic Liquid Crystals", J. Mater. Sci., vol. 5, pp. 83–88 (1994).
N. Boden, et al., "First Observation of an n–Doped Quasi–One–Dimensional Electronically–Conducting Discotic Liquid Crystal", J. Am. Chem. Soc., vol. 116, pp. 10807–10808 (1994).
J. Kido, et al., "Bright Organic Electroluminescent Devices Having a Metal–Doped Electron–Injecting Layer", Appl. Phys. Lett., vol. 73, No. 20, pp. 2866–2868 (1998).
A. Yamamori, et al., "Doped Organic Light Emitting Diodes Having a 650–nm–Thick Hole Transport Layer", Appl. Phys. Lett., vol. 72, No. 17, pp. 2147–2149 (1998).

* cited by examiner

Primary Examiner—Shean C. Wu
(74) Attorney, Agent, or Firm—Fitzpatrick, Cella, Harper & Scinto

(57) ABSTRACT

An organic electroluminescence device is made to show an improved carrier transporting ability and an improved carrier injecting property by doping a liquid crystal compound having a high degree of carrier mobility without generating any ionic current. The organic electroluminescence device comprises a carrier transport layer formed by doping a smectic liquid crystal compound having a hexagonal order structure with a Lewis acid compound, a light-emitting layer and a protection layer arranged between the carrier transport layer and the light-emitting layer and composed of an organic compound having a carrier transporting property of the same type as that of carrier transport layer and a carrier conducting property of the type different from that of the carrier transport layer.

8 Claims, 3 Drawing Sheets

LIQUID CRYSTAL DEVICE AND ORGANIC ELECTROLUMINESCENCE DEVICE USING THE SAME

BACKGROUND OF THE INVENTION

1. Field of the Invention

This invention relates to an organic electroluminescence device (to be referred to as "organic EL device" hereinafter) to be used for a display or the like as light-emitting device and also to a liquid crystal device having a high electric current carrying ability and an excellent carrier injection property and adapted to be used for such an organic EL device.

2. Related Background Art

Intensive research efforts are currently being paid for developing applications of organic EL devices that can be used as light-emitting devices showing a quick responsiveness and a high light-emitting efficiency. FIGS. 1 and 2 of the accompanying drawings schematically illustrate the basic configuration of the organic EL device (see "Macromol. Symp." 125, 1–48 (1997)). Referring to FIGS. 1 and 2, there are shown an organic compound layers 10, a metal electrode 11, a light-emitting layer 12, a hole transport layer 13, a transparent electrode 14, a transparent substrate 15 and an electron transport layer 16. As shown in FIGS. 1 and 2, organic EL devices generally have an organic compound layers 10 having a multilayer structure and arranged between a transparent electrode 14 formed on a transparent electrode 15 and a metal electrode 11.

In the instance of FIG. 1, the multilayer organic compound layer 10 include a light-emitting layer 12 and a hole transport layer 13. The transparent electrode 14 is typically made of ITO that has a large work function so that the device may show an excellent hole injection characteristic for injecting holes from the transparent electrode 14 to the hole transport layer 13. The metal electrode 11 is typically made of Al, Mg or an alloy thereof, which have a small work function so that the device may show an excellent electron injection characteristic for injecting electrons into the organic compound layer 10. The electrodes typically have a thickness of 50 to 200 nm.

The light-emitting layer 12 is typically made of an aluminum-quinolinol complex derivative that shows an electron transport property and also a light-emitting property. The chemical structure of Alq3 is shown below as a typical example of such derivatives. The hole transport layer 13 is typically made of a phenyldiamine derivative having an electron providing ability such as α-NPD as shown below.

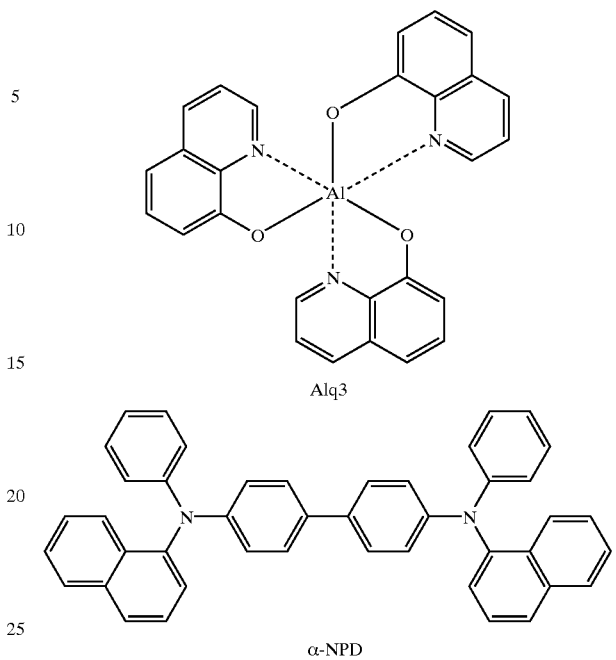

Alq3

α-NPD

An organic EL device having a configuration as described above shows an rectifying property when a voltage is applied thereto and injects electrons from the metal electrode 11 into the light-emitting layer 12 and holes from the transparent electrode 14 when an electric field is applied thereto in such a way that the metal electrode 11 and the transparent electrode 14 operate respectively as a cathode and anode. The injected holes and electrons are recombined to produce excitons in the light-emitting layer 12 and emit light. At this time, the hole transport layer 13 takes a role of blocking electrons to improve the recombination efficiency along the interface of the light-emitting layer and the hole transport layer, which hence increases the light-emitting efficiency.

With the arrangement of FIG. 2, an electron transport layer 16 is provided between the metal electrode 11 and the light-emitting layer 12. With this arrangement, the light-emitting operation and the electron/hole transporting operation are separated to further improve the carrier blocking effect and the light-emitting efficiency. The electron transport layer 16 may typically be made of a oxadiazole derivative. The above described organic compound layer, 10 is typically made to have a two-layered or three-layered structure with a total film thickness of about 50 to 500 nm.

In any of the above illustrated organic EL devices, the degree of luminance of emitted light of the device depends on the performance of injecting electrons and holes from the respective electrodes of the device. When amorphous materials such as Alq3 and α-NPD are used in a manner as described above, it is believed that the device may not necessarily show a satisfactory carrier injecting performance because of the problem of interfaces of the electrodes/organic-compound layer.

On the other hand, attempts have been made to utilize the structural regularity of liquid crystal as will be discussed hereinafter for the purpose of improving the carrier injection characteristic and the carrier transport characteristic of the device.

Liquid crystal materials having a high carrier transporting ability includes discotic liquid crystal compounds and smectic liquid crystal compounds that have a well-ordered structure. These liquid crystal materials normally show a degree of mobility that is as high as $10^{-6}$ to $10^{-3}$ cm$^2$/Vsec. It is expected to realize a high productivity and an excellent performance on the part of organic electroluminescence devices by using such liquid crystal compounds. Applications of such compounds to solid electrolytes are also being studied.

Some of the characteristic aspects of the carrier transport effect that can be achieved by using liquid crystal materials include the following.
(1) A high carrier transporting ability can be achieved by the regular spatial structure obtained by the orientation of liquid crystal itself.
(2) A high electron injecting property can be achieved as a result of orientation of the π electron conjugate planes of liquid crystal molecules toward the electrode interface.

Reports on attempts for doping a material having a carrier transporting ability with a compound having an electron receiving property or an electron providing property relative to the organic compound layer are also known. They include the following.
(1) Yamamoto et al., Applied Physics Ltter Vol. 72, No. 17, p. 2147 (1998)
(2) Kido et al., Applied Physics Letter Vol. 73, No. 20, p. 2866 (1998)

The above reference (1) reports that the authors have succeeded in raising the luminance of emitted light by forming a hole transport layer, using a hole transporting polymer material prepared by mixing a salt containing SbCl$_6$— with a polymer material by 20 mol %, producing holes in the hole transport layer and thereby raising the carrier density.

The above reference (2) reports that the electron injecting performance is improved by doping the electron transport layer with metal Li.

Reports on doping liquid crystal materials include the following.
(3) Boden et al, J. Am. Chem. Soc. Vol. 116, No. 23, p. 10808 (1994)
(4) J. Material Science: Materials in Electronics 5, p. 83 (1994)

The above reference (3) reports that an n-type semiconductor whose main carriers are electrons is formed by doping a discotic liquid crystal compound having a tricycloquinazoline skeleton with potassium by 6 mol %.

The above reference (4) reports that a p-type semiconductor whose main carriers are holes is formed by doping a discotic liquid crystal compound having a triphenylene skeleton with AlCl3.

However, when devices, which may not necessarily be light-emitting devices, are formed by using a liquid crystal composition prepared by doping a liquid crystal material with an inorganic compound in a manner as describe above, there arises a problem that not only carriers (holes or electrons) that operate as electrons but also ionized (cationized or anionized) dopants move in the liquid crystal material to cause an ionic electric current to flow in the device when an external electric field is applied thereto.

An ionic electric current is generated when the dopant itself moves. It is poorly reversible in terms of current characteristics and therefore not only the initial performance but also the durability of the device becomes problematic. Particularly, since liquid crystal materials have properties that are intermediary between crystal and liquid, the generation of an ionic electric current is more serious if compared with amorphous materials and polymer materials.

Additionally, if a discotic liquid crystal compound is used as a liquid crystal material, the temperature range in which the compound can be utilized effectively is limited because the liquid crystal temperature is high. Furthermore, while a discotic liquid crystal compound needs to be oriented uniformly in a direction that agrees with the main axes of liquid crystal molecules for the liquid crystal material to obtain a high degree of electric conductivity, it is relatively difficult to orient the liquid crystal material so as to make it have a predetermined structure if compared with other liquid crystal materials because the device is disk-shaped.

On the other hand, a smectic liquid crystal compound provides an advantage that the orientation process is relatively simple and easy, because only liquid crystal molecules are required to be arranged in parallel relative to the electrodes if the main axes of liquid crystal molecules are randomly arranged in terms of direction. It is also characterized in that it provides a high electric conductivity with such a rough orientation structure.

However, smectic liquid crystal compounds are accompanied by a problem that the device prepared by using such a liquid crystal compound generates an ionic electric current to obstruct the proper function of the device when the compound is doped because the dopant itself moves as ions within the device.

SUMMARY OF THE INVENTION

In view of the above identified problems, it is therefore an object of the present invention to realize a carrier transport layer by using a technique of doping a liquid crystal material and suppressing the phenomenon that the dopant itself becomes a source of ionic electric current so as to selectively improve the performance of carriers that may be electrons or holes.

Another object of the present invention is to provide a liquid crystal device that is improved in terms of carrier transport ability and carrier injection performance and also an organic EL device that has an improved light-emitting efficiency by using a liquid crystal layer of such a liquid crystal device for the carrier transport layer.

In a first aspect of the invention, the above objects are achieved by providing a liquid crystal device comprising at least one liquid crystal composition layer sandwiched between said pair of electrodes, said liquid crystal composition being formed by doping a smectic liquid crystal compound with a Lewis acid compound, wherein said smectic liquid crystal compound has a hexagonal order structure.

Preferably, in a liquid crystal device according to the invention, the smectic liquid crystal composition has a molecular structure containing a tertiary amine. Preferably, said liquid crystal composition layer is formed by an injection method that utilizes spin coating or the capillary phenomenon.

In a second aspect of the invention, there is provided an organic electroluminescence device comprising a plurality of organic compound layers arranged between a pair of electrodes, one of said organic compound layers being a carrier transport layer composed of a liquid crystal composition formed by doping a smectic liquid crystal compound with a Lewis acide type compound, another one of said organic compound layers being a light-emitting layer.

Preferably, in an organic electroluminescence device according to the invention, a protection layer composed of an organic compound having a carrier transporting property of the same type as that of the carrier transport layer and a carrier conductivity different from that of the carrier transport layer is formed between the carrier transport layer, and the light-emitting layer and one of the pair of electrodes is formed in the form a plurality of pieces arranged on a substrate and driven by way of thin film transistors.

DETAILED DESCRIPTION OF THE DRAWINGS

Figure 6:
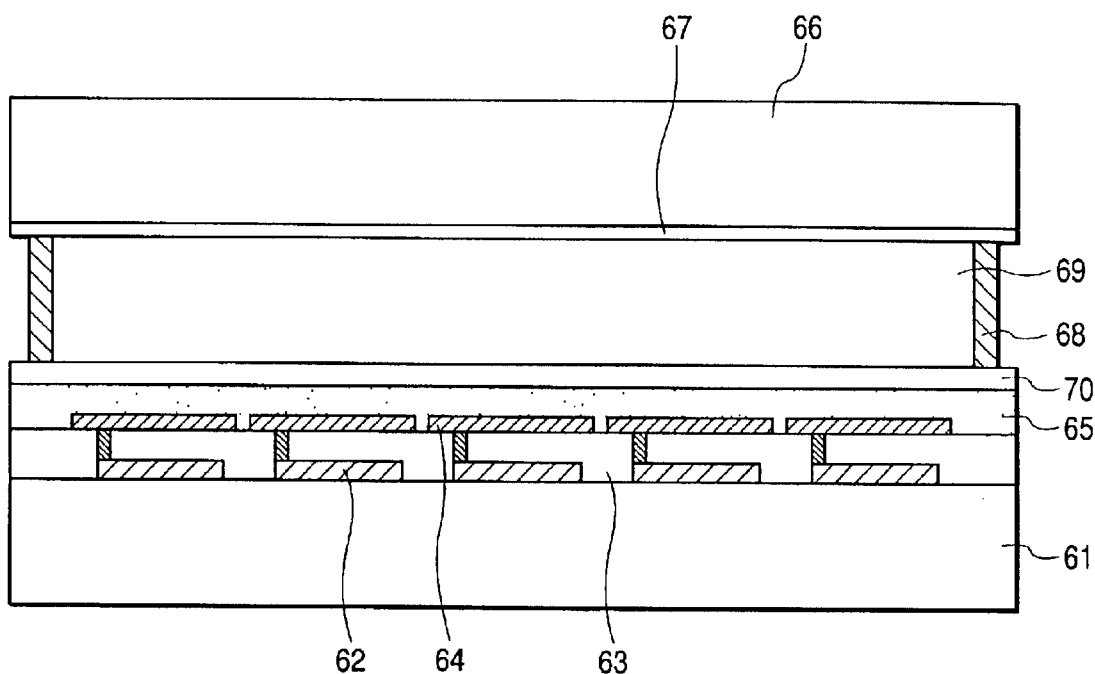
FIG. 6 is a schematic cross sectional view of an embodiment of organic EL device according to the invention.

In FIG. 6, each of reference symbols 61 and 66 denotes a substrate, reference symbols 63, 64 and 65 respectively denote a planarized layer, a cathode and a light-emitting layer, whereas reference symbols 67, 68, 69 and 70 respectively denote an anode, a spacer, a liquid crystal composition layer and a protection layer.

DETAILED DESCRIPTION OF THE PREFERRED EMBODIMENTS

This invention utilizes the self organizing property of liquid crystal and also a good electric current transport characteristic of liquid crystal that is attributable to its good spatial order. The present invention also relates to the use of a carrier transport layer having a high carrier transporting ability and an improved carrier injection performance achieved by doping a smectic liquid crystal with a specific compound to obtain a doped liquid crystal composition and thereby suppressing the ionic electric current thereof. The present invention is intended to apply such a transport layer to various electronic devices to improve the characteristics of the device.

The organic EL device of the present invention employs the liquid crystal device of the invention, the liquid crystal composition layer of which is used as a carrier transport layer, thereby achieving a high electric current density as well as high luminance.

A liquid crystal compound generally has a band gap of 2 to 3 eV and shows a low free carrier density. Therefore, it is generally an insulator. However, in the case of an organic EL device, a liquid crystal compound can be used for it provided that the latter has an ability of transporting injected carriers even if its free carrier density is low, because carriers of electrons or holes, are injected from the electrodes. Furthermore, the carrier transporting ability of the liquid crystal compound can be improved to raise the efficiency by doping the liquid crystal composition in order to raise the free carrier density.

According to the invention, a Lewis acid compound having an electron receiving property is used as a dopant for doping the liquid crystal compound. Specific examples of Lewis acid compounds include the following.

$Br_2$, $I_2$, $Cl_2$, $ICl$, $ICl_3$, $AsF_5$, $BF_3$, $PF_5$, $SbF_5$, $SO_3$, $FeCl_3$, $AlCl_3$, $BCl_3$, $BBr_3$.

$SbCl_6-$, $SbF_6-$, $AsF_6-$, $BF_4-$, $FeOCl$, $TiCl_4$, $ZrCl_4$, $HfCl_4$, $WF_6$, $WCl_6$ and $UF_6$.

A salt having a structure as shown below can be used as dopant when anions such as $SbCl_6-$ ions are doped.

Dopant A

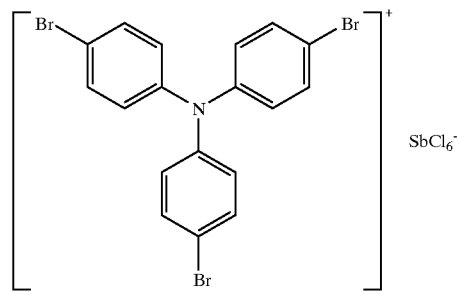

A Lewis acid compound as used herein refers to a compound that can operate as an electron pair receiver for a Lewis base compound that provides electron pairs. Generally, when a Lewis acid compound receives electron pairs, it shares electrons with a Lewis base compound to give rise to a net result of drawing electrons from the base compound.

According to the invention, the Lewis acid compound that operates as a dopant receives electrons from the smectic liquid crystal compound that operates as a Lewis base compound to produce a salt.

As a result, the Lewis base compound becomes cations and holes are produced as electric current carriers. On the other hand, the Lewis acid compound becomes anions, which form pairs.

Examples of smectic liquid crystal compounds that can preferably be used for the purpose of the invention are listed below. When such a liquid crystal compound is doped with a Lewis acid compound preferably by 0.1 to 30 mol %, the liquid crystal compound operates as a Lewis acid and generates holes effectively.

Liquid crystal compound 1

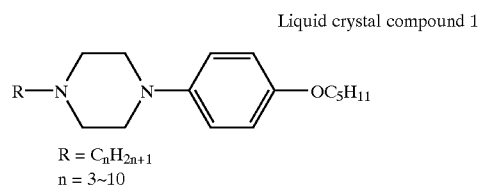

$R = C_nH_{2n+1}$
$n = 3\sim10$

Liquid crystal compound 2

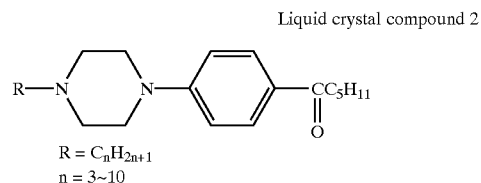

$R = C_nH_{2n+1}$
$n = 3\sim10$

Liquid crystal compound 3

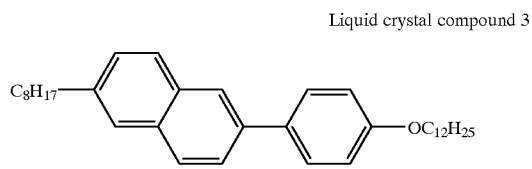

Liquid crystal compound 4

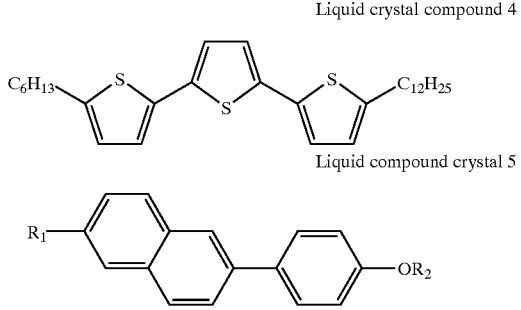

Liquid compound crystal 5

As pointed out earlier, in the case of a device that operates on the basis of conduction of electron carriers, the ionic electric current induced as a result of doping with Lewis acid suppresses the characteristics of the device. Since a liquid crystal have properties that are intermediary between crystal and liquid, an ionic electric current can be generated particularly by the doping.

As a result of intensive research efforts of the inventors of the present invention, it was found that the ionic electric current can be made negligible when a smectic liquid crystal compound having an enhanced order parameter is used. More specifically, it is preferable to use a smectic liquid crystal having a hexagonal order structure that is typically selected from SmB, SmE, SmF, SmG, SmI and SmJ, which show a liquid crystal phase.

For instance, when SmA or SmC that has a low order parameter and hence does not have a hexagonal order structure is doped with a Lewis acid compound, the ratio of the ionic electric current to the electron type electric current is from 1:10 to 10:1. In other words, the ionic electric current is very large and provides a great disadvantage when such a liquid crystal is used for electronic devices. On the other hand, when a liquid crystal compound having a hexagonal order structure is used, the ratio of the ionic electric current to the electron type electric current is 1 or less:100. In other words, the electron type electric current is dominant and the ionic electric current is negligible.

When a liquid crystal compound to be used for the purpose of the invention has hexagonal system, not only the ionic electric current becomes very small and negligible as described above but also a high carrier mobility can be obtained because the order parameter is high and a hopping conduction of electricity can easily occur. Particularly, a high doping effect can be obtained when a liquid crystal compound that contains a tertiary amine in the molecular structure is doped with a Lewis acid compound, because nitrogen atoms show a strong Lewis base property relative to the Lewis acid compound and hence they interact strongly to generate holes with an enhanced level of probability.

Figure 4:
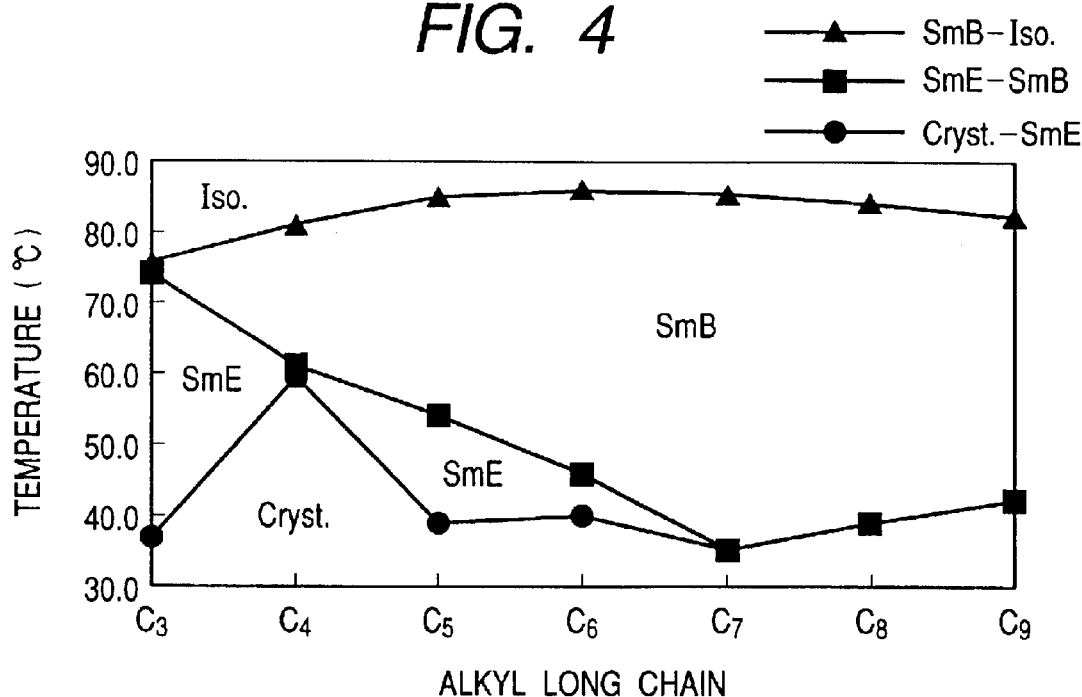
FIG. 4 is a graph illustrating the change in the phase transition series caused by an alkyl long chain of liquid crystal compound 1.
Figure 5:
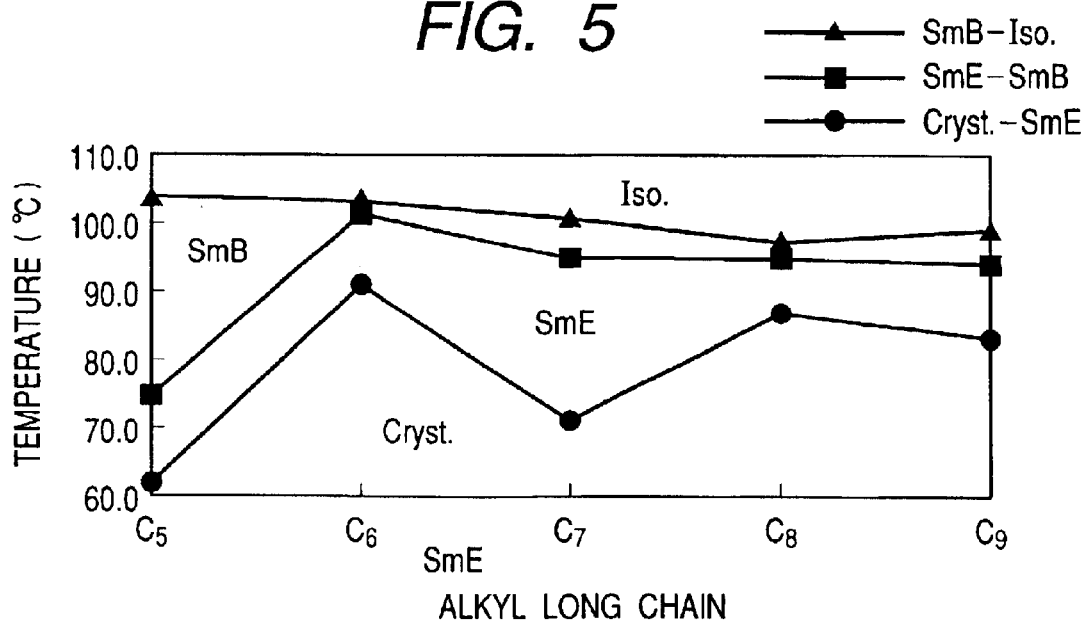
FIG. 5 is a graph illustrating the change in the phase transition series caused by an alkyl long chain of liquid crystal compound 2.

Of the specific smectic liquid crystal compounds listed above, the liquid crystal compounds 1 and 2 are those containing a tertiary amine in the molecular structure thereof and having a hexagonal order structure. FIGS. 4 and 5 show the change in the liquid crystal phase transition series with respect to the length of the side chain of each of the liquid crystal compounds.

The use of liquid crystal doped with Lewis acid provide three major advantages as listed below.
1. The hopping conduction is improved to raise the mobility of liquid crystal due to the order parameter of liquid crystal.
2. Additionally, the number of free carriers increases when holes are generated as a result of doping, using a Lewis acid.
3. The carrier injection effect from the electrode to the liquid crystal is improved along the electrode/(liquid crystal+ Lewis acid) interface to increase the electric current.

For instance, when the liquid crystal is "horizontally" oriented along the ITO interface and the π electron conjugate plane that is rich in liquid crystal contacts with the electrode over a large area, carriers are injected smoothly into liquid crystal molecules from the electrode when an electric field is applied.

If free carriers that are generated by a Lewis acid are drive to move by the electric field, the current characteristic is effectively improved because carriers are injected smoothly.

Thus, the thee major factors of "mobility", "number of free carriers" and "carrier injection characteristic" that determine the current characteristic are improved at the same time to obtain a large electric current with a low voltage by combining a Lewis acid and a liquid crystal.

As a result of doping the liquid crystal compound with a Lewis acid compound, it is possible to obtain an auxiliary effect of broadening the temperature range of the liquid crystal phase depending on the type of the dopant. In other words, either the upper limit of the liquid crystal phase temperature may be raised or the lower limit of the temperature may be lowered. It may be safe to assume that this effect is obtained as a result of increased interactions among liquid crystal molecules.

A device according to the invention can be made to be more stable when a protection layer having a hole conductivity different from the liquid crystal composition layer is laid on the latter that is obtained by doping a smectic liquid crystal compound with a Lewis acid compound. The protection layer takes a role of preventing the dopant contained in the liquid crystal composition layer from diffusing to improve the durability of the device. Particularly, in the case of an organic EL device, the protection layer also takes a role of solving the problem of extinction of excitation energy at the center of emission of light. If such a protection layer is not provided and hence the electron transporting compound layer is held in direct contact with the liquid crystal composition layer, some of the Lewis acid compound used to dope the hole transporting liquid crystal composition layer can diffuse into the adjacently located electron transporting compound layer to produce a new electron level and obstruct movements of electrons and emission of light.

Figure 1:
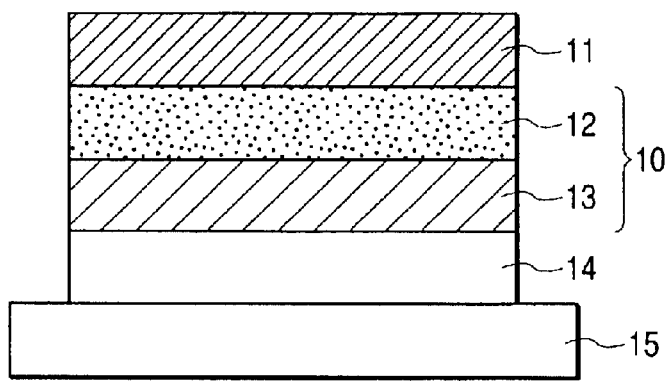
FIG. 1 is a schematic cross sectional view of an organic EL device, illustrating the configuration thereof.
Figure 2:
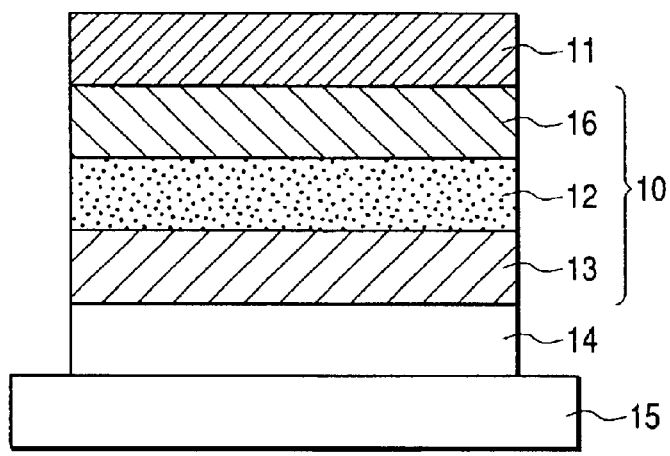
FIG. 2 is a schematic cross sectional view of another organic EL device, illustrating the configuration thereof.
Figure 3:
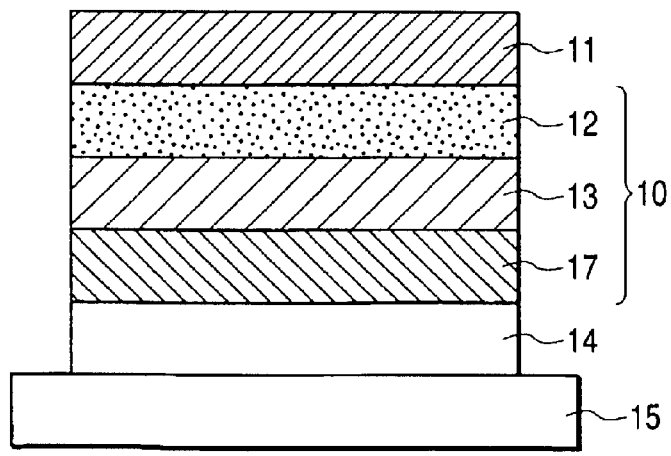
FIG. 3 is a schematic cross sectional view of still another organic EL device, illustrating the configuration thereof.

FIG. 3 is a schematic cross sectional view of a preferred embodiment of an organic EL device according to the invention. In FIG. 3, reference symbol 17 denotes a liquid crystal composition layer that is formed by doping a smectic liquid crystal compound with a Lewis acid compound and operates as a hole transport layer. In FIG. 3, the components that are the same as or similar to those of FIG. 1 are denoted respectively by the same reference symbols. For the purpose of the invention, the components other than the liquid crystal composition layer 17 such as the light-emitting layer 12, the cathode 11 and the anode 14 can be formed by using known conventional materials. The transparent substrate 15 may be used whenever necessary. If necessary, another substrate may be used at the cathode 11 side. The carrier transport layer 13 in FIG. 3 corresponds to a protection layer that is described above. The embodiment of FIG. 3 may additionally comprise an electron transport layer 16 as illustrated in FIG. 2.

For the purpose of the invention, a liquid crystal composition layer can be formed by a method of jointly depositing a liquid crystal compound and a Lewis acid compound. Alternatively, a spin coating method or an injection method may be used. With a spin coating method, after forming an organic compound layer on each of the cathode and the anode that are formed, if necessary, by using a substrate, the electrodes are coated with a liquid crystal composition by spin coating and one of the electrodes is pressed against the other. The organic compound on the electrodes may be formed on the liquid crystal composition layer by deposition.

With an injection method, on the other hand, after forming an organic compound layer on each of the cathode and the anode that are formed, if necessary, by using a substrate, the electrodes are arranged vis-a-vis with spacers arranged between them and the liquid crystal composition is injected into the gap separating the electrodes by utilizing the capillary phenomenon.

Since the electric resistance of the liquid crystal composition layer of a device according to the invention is very small if compared with the light-emitting layer and the other organic compound layers, the liquid crystal composition layer can be made to have a large film thickness. More specifically, the liquid crystal composition layer can be made to has a film thickness between 0.5 and 5.0 $\mu$m, which is greater than the total film thickness of all the other organic compound layers. Thus, a spin coating method or an injection method can be used for forming the liquid crystal composition layer.

In a preferred embodiment of an organic EL device according to the invention, one of the pair of electrodes is formed in the form a plurality of pieces arranged on a substrate and thin film transistors (TFTs) are connected to the respective pieces of electrode by matrix wiring so that the pieces of electrodes may be driven by an active matrix drive method. Then, the embodiment can be used as a display device. FIG. 6 is a schematic cross sectional view of this embodiment.

In the arrangement of FIG. 6, the cathode 67 may be a 50 to 300 nm thick ITO and the light-emitting layer 65 may be made of Alq3, whereas the protection layer 70 may be formed by vacuum deposition of $\alpha$-NPD. Both the light-emitting layer 65 and the protection layer 70 may have a thickness between 20 and 100 nm. The spacers 68 may be formed by patterning a resin material by photolithography or by using spherical beads. The TFTs 62 comprise an active layer that is formed by using an amorphous silicon or polysilicon. The cathode 64 is typically made of metal that is subjected to patterning and insulated and fed with an electric current by way of the TFTs 62. Thus, holes and electrons are supplied to each pixel of the light-emitting layer 67 between the cathode 64 and the anode 67 and hence the emission of light of each pixel can be controlled. When this embodiment is used as a display device, the substrate 66 may be made of a transparent material such as glass and the cathode 64 may be made of a metal having a high light reflecting ability so as to operate as a reflection layer. Then, the displayed image is viewed from the substrate 66 side.

EXAMPLES

Example 1

Comparative Example 1

A liquid crystal compound 1 with n=9 as listed above was mixed with 3 mol % $AlCl_3$ and the mixture was heated, molted and mixed well to prepare a doped liquid crystal composition. On the other hand, this, a 70 nm thick ITO electrode having an electrode area of 2 mm$\phi$ was formed on each of a pair of glass substrates by deposition using a mask. Subsequently, the electrodes were arranged vis-a-vis and bonded together by means of an epoxy adhesive that was mixed with perfectly spherical silica bead spacers having a diameter of 5 $\mu$m to produce cells. The above liquid crystal composition was injected into the cells in an isotropic phase to obtain the liquid crystal device of Example 1. In Comparative Example 1, a liquid crystal device was prepared as in Example 1 except that a liquid crystal compound that was not doped with $AlCl_3$ was injected into similar cells.

The obtained device was put into a temperature controller (FP-900 & hot stage HT-82: tradenames available from Mettler) and held to a temperature level good for showing a liquid crystal phase. A voltage was applied to the ITO electrodes for measurement from a micro-ammeter (4140B: tradename, available from HP) to observe the electro-conductivity of the above composition in the liquid crystal phase. As a result, it was found that the device of Example 1 showed a current value that was more than 100 times greater than the device of Comparative Device 1 for the same applied voltage to prove that a remarkable improvement of electro-conductivity was achieved.

The frequency applied to the device was made to vary by using a 4192A available from HP to observe the frequency characteristic of the electro-conductivity (which is referred to as frequency distribution). When the current is ionic, the mobility is low and hence the dispersion frequency is also low because the electric current flows by movement of large ions. In the case of an electric current produced by hole conduction, on the other hand, the mobility is high and hence the frequency distribution is also high unlike an ionic current produced as a result of movements of ions. Both the specimen of Example 1 and that of Comparative Example 1 showed a similar value (greater than $10^6$ Hz) to prove that the electric current was not an ionic current at that temperature.

When, on the other hand, the temperature of the device was changed to make the device go out of the liquid crystal phase by means of the temperature controller, it was found that the electro-conductivity was highest in the liquid crystal phase but remarkably low in an isotropic phase. The fall of the electro-conductivity was not so remarkably in a crystal phase probably because the structure in the liquid crystal phase was retained in the crystal phase. It was also found that the frequency distribution falls to less than $10^3$ Hz in an isotropic phase and becomes lower as the temperature falls even in the same isotropic phase.

From these results, it was found that the device of Example 1 generated free carriers to produce a hole current and improve the electro-conductivity without generating an ionic current because the liquid crystal compound that was doped with the Lewis type compound operated very effectively.

Example 2

Comparative Example 2

In Example 2, an organic EL device was prepared in a manner as described below.

A liquid crystal composition the same as the one used in Example 1 was dissolved in chloroform to produce a 0.1 mol/liter solution. Then, an ITO electrode prepared as in Example 1 was coated with the solution by spin coating with 1,000 rpm for 20 seconds and then the solvent was dried to produce an about 200 nm thick liquid crystal composition layer on the ITO electrode.

Then, a 50 nm thick $\alpha$-NPD layer and a 50 nm thick Alq3 layer were sequentially formed on the liquid crystal composition layer of the electrode by vacuum evaporation at a vacuum of $10^4$ Pa. Additionally, Al was deposited on the ITO electrode to a thickness of 100 nm by deposition to obtain the organic EL device of Example 2.

In Comparative Example 2, an organic EL device was prepared as in Example 2 except that the same liquid crystal compound that was not doped with $AlCl_3$ was used.

The current/voltage characteristic of the device of Example 2 and that of the device of Comparative Example 2 were observed by using the ITO electrode of each device as an anode. The 4140B as described above was used for the observation. Each of the devices was put into a temperature controller which was the same as the above described one and the temperature was made to fall from the isotropic temperature level to find that the device of Example 2 showed a rapid rise of the electro-conductivity in the temperature range of the liquid crystal phase. The luminance of light emitted from the light-emitting substrate was also raised.

The device of Example 2 showed an electric current 150 times as much as the device of Comparative Example 2 in the temperature range of the liquid crystal phase when a voltage of 20V was applied. The luminance of light emitted from the device of Example 2 was 120 times as much as the device of Comparative Example 2. Thus, the doping effect of the Lewis acid compound was confirmed for raising both the electric current and the efficiency of emission of light. While a similar effect was obtained at temperatures lower than the liquid crystal phase temperature range, both the electro-conductivity and the luminance of emitted light were found to be slightly lower than the corresponding levels in the liquid crystal phase temperature range. This is probably because the structure of the liquid crystal compound is maintained at temperatures lower than the liquid crystal phase temperature range.

As for the carrier injecting property, probably the $\pi$ electron conjugate structure of liquid crystal molecules was oriented along the electrode interface and acted advantageously on the electrode to increase the amount of injected electrons since the liquid crystal was brought into the liquid crystal phase of a hexagonal system because of the fact that the electro-conductivity was low at isotropic temperatures.

Example 3

A liquid crystal compound with $R_1=C_3H_{17}$ and $R_2=C_4H_9$ as listed above was doped with ferric chloride $FeCl_3$ to a ratio of 1 mol % and dissolved into a chloroform solution. Subsequently, the chloroform was eliminated by evaporation to prepare a liquid crystal composition. A 70 nm thick ITO electrode was formed on one of a pair of glass substrate, while a 100 nm thick Al layer, a 5 nm thick AlLi alloy layer (Li content: 1.8 wt %), a 50 nm thick Alq3 layer and a 50 nm thick $\alpha$-NPD layer were sequentially formed on the other glass substrate. Spacers having a thickness of 3 $\mu$m were formed on the ITO electrode by patterning polyimide and bonded to the $\alpha$-NPD layer on the other glass substrate at and around the periphery thereof to produce cells. The above liquid crystal composition was made to adhere to the ends of the cells at the substrate side and injected into the cells at isotropic temperature to produce an organic EL device. When a voltage is applied to the obtained organic EL device, it showed an excellent electro-conductivity in the liquid crystal phase temperature range and emitted light from the ITO electrode side to an intensity of 100 cd/m² when a voltage of 20V was applied to the electrodes. A similar effect was observed at temperature lower than the liquid crystal phase temperature range.

Example 4

A display device was prepared by using TFTs as shown in FIG. 6. As for the arrangement at the part where a voltage is applied, a 100 nm thick Al layer, a 5 nm thick AlLi alloy (Li content: 1.8 wt %) layer, a 50 nm thick Alq3 layer, a 50 nm thick $\alpha$-NPD layer, a 0.7 $\mu$m thick liquid crystal composition layer and a 100 nm thick ITO layer were sequentially formed on the substrate carrying the TFTs in the above mentioned order.

As for the liquid crystal composition, a liquid crystal compound 1 with n=7 as listed above was doped with the above described dopant A to a ratio of 5 mol % to prepare the liquid crystal composition. Polyimide was patterned by photolithography to produce 0.7 $\mu$m high spacers. The two substrates were bonded to each other by means of an adhesive to produce cells. The liquid crystal composition was made to adhere to the ends of the cells at the substrate side and injected into the cells at an isotropic temperature to produce an organic EL device. It was confirmed that the pixels can emit light independently from the ITO electrode side by feeding the cathode (Al/AlLi) with an electric current by way of the TFTs. Since emitted light can be taken out from the side opposite to the TFT substrate, the device is free from any reduction in the aperture ratio due to the TFTs.

As described above in detail, a liquid crystal device according to the invention can be applied to various electronic devices because the liquid crystal composition layer shows a high carrier transporting ability and an excellent carrier injection property without generating any ionic current. Additionally, an organic EL device according to the invention shows a remarkable improvement in terms of luminance of emitted light because the liquid crystal composition layer is used as a carrier transport layer. Furthermore, since the liquid crystal composition layer is formed by a spin coating method or an injection method, the tolerance of preparing the device is raised and hence it is possible to prepare a TFT drive type light-emitting device having a large aperture ratio.

What is claimed is:

1. A liquid crystal device comprising a pair of electrodes formed on at least one substrate and at least one liquid crystal composition layer containing a smectic liquid crystal compound and a Lewis acid compound sandwiched between said pair of electrodes, wherein said smectic liquid crystal compound has a hexagonal order structure.

2. The liquid crystal device according to claim 1, wherein said smectic liquid crystal compound is a Lewis base compound.

3. The liquid crystal device according to claim 2, wherein said smectic liquid crystal compound has a molecular structure containing a tertiary amine.

4. The liquid crystal device according to claim 1, wherein said liquid crystal composition layer has a hole transporting property.

5. An organic electroluminescence device comprising a pair of electrodes formed on at least one substrate, and at least one carrier transport layer and at least one light-emitting layer arranged between said pair of electrodes, said carrier transport layer being composed of a liquid crystal composition layer containing a smectic liquid crystal compound and a Lewis acide compound.

6. The organic electroluminescence device according to claim 5, wherein said smectic liquid crystal compound has a hexagonal order structure.

7. The organic electroluminescence device according to claim 5, wherein said carrier transport layer is a hole transport layer.

8. The organic electroluminescence device according to claim 5, wherein a protection layer is arranged between said carrier transport layer composed of the liquid crystal composition layer and said light-emitting layer, said protection layer being composed of an organic compound having a carrier transporting property of the same type as that of said carrier transport layer and a carrier conducting property of the type different from that of said carrier transport layer.

* * * * *

UNITED STATES PATENT AND TRADEMARK OFFICE
CERTIFICATE OF CORRECTION

PATENT NO. : 6,737,127 B2
DATED : May 18, 2004
INVENTOR(S) : Akira Tsuboyama et al.

It is certified that error appears in the above-identified patent and that said Letters Patent is hereby corrected as shown below:

Title page,
Item [30], Foreign Application Priority Data, "2001/164348" should read -- 2001-164348 --.

Column 3,
Line 23, "Ltter" should read -- Letter --.

Column 8,
Line 10, "are drive" should read -- are driven --.

Column 9,
Line 21, "has" should read -- have --.

Signed and Sealed this

Seventh Day of December, 2004

JON W. DUDAS
*Director of the United States Patent and Trademark Office*